United States Patent Office 3,171,983
Patented Mar. 2, 1965

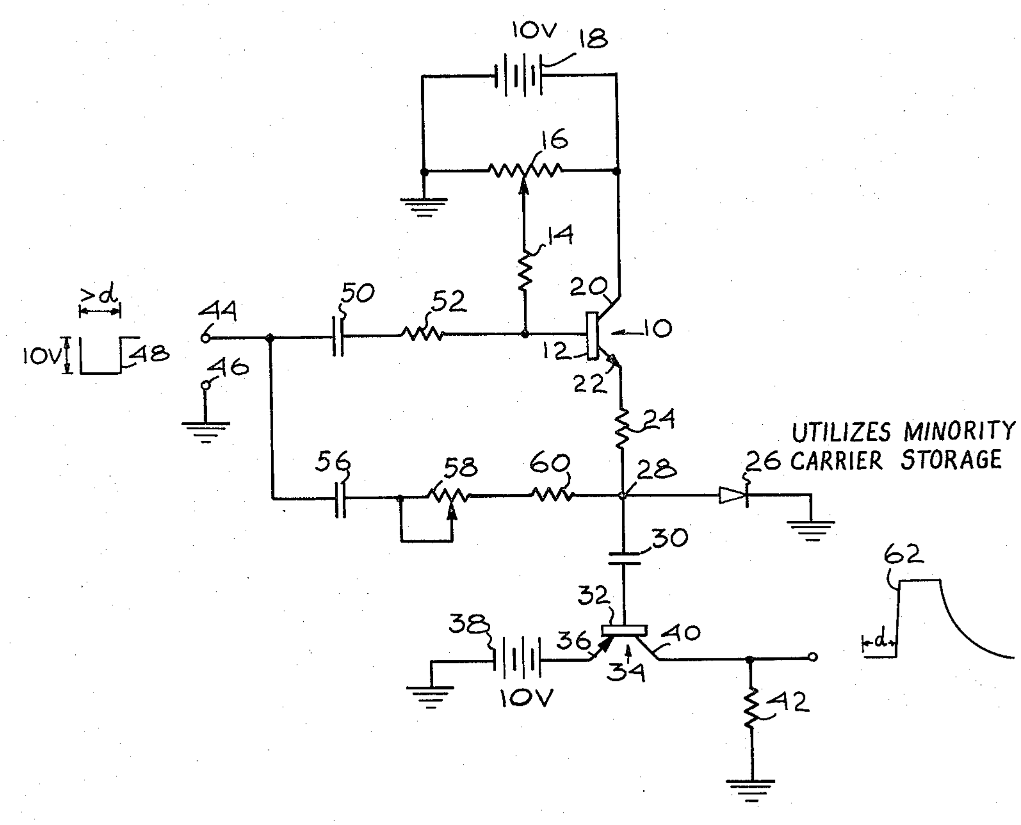
JOHN J. HICKEY
INVENTOR.
BY Jerry G. Dinardo
AGENT

3,171,983
TIME DELAY CIRCUIT EMPLOYING MINORITY CARRIER STORAGE DIODE TO EFFECT DELAY

John J. Hickey, Hawthorne, Calif., assignor, by mesne assignments, to Thompson Ramo Wooldridge Inc., Cleveland, Ohio, a corporation of Ohio Filed Oct. 1, 1962, Ser. No. 227,238
7 Claims. (Cl. 307—88.5)

This invention relates generally to time delay circuits and, more particularly, to circuits capable of generating time delays which can be varied from a few nanoseconds to hundreds of nanoseconds.

The generation of time delay pulses which are delayed by times in the region of nanoseconds is usually accomplished through the use of coaxial cables. A pulse applied at one end of the cable arrives at the other end a finite time later, the length of time, or delay, depending upon the length of the cable. Coaxial cables suffer from the disadvantages of bulkiness and the inability to continuously vary the delay.

Accordingly, an object of this invention is to provide a time delay circuit capable of generating time delay pulses that are continuously variable in time delay in the nanosecond region.

A further object is to provide a compact time delay circuit for producing pulses with time delays which can be varied from a few nanoseconds to a microsecond.

The foregoing and other objects are achieved in accordance with the invention by utilizing the charge storage capacity of a semiconductor diode to generate the desired time delay. A series circuit is comprised of a semiconductor diode, a normally closed switching device, such as a transistor emitter follower circuit, and a voltage source for causing current of a predetermined magnitude to flow through the semiconductor diode in its forward direction. A load circuit is coupled to the diode to receive the voltage developed thereacross.

A trigger pulse is applied to the switching device to render it nonconducting and thereby interrupt the flow of current through the diode. Due to its semiconducting characteristics, the diode is left with an amount of stored charge which maintains the diode conducting until the charge is depleted. The charge is depleted by applying the same trigger pulse to the diode to cause current flow therethrough in the reverse direction. When the charge is depleted, a voltage pulse is developed across the diode and coupled to the load circuit.

The time delay is determined by the amount of charge originally stored in the diode, which can be varied by altering the current that is caused to flow in the diode in the forward direction, and by the amount of current flowing in the reverse direction of the diode, which also can be varied.

In the drawing, the single figure is a schematic diagram of a time delay circuit according to the invention.

Referring to the drawing, an n-p-n transistor 10, connected in an emitter-follower circuit, has its base 12 connected through a series resistor 14 to the variable arm of a potentiometer 16. A direct current voltage source 18, such as 10 volts, connected across the potentiometer 16 supplies operating potentials for the transistor 10. The collector 20 of the transistor 10 is connected to the positive side of the source 18, the negative side of the source 18 being grounded. The emitter 22 of the transistor 10 is connected in series with a resistor 24 and a semiconductor diode 26.

The junction 28 between the resistor 24 and diode 26 is coupled through a capacitor 30 to the base 32 of a p-n-p transistor 34, connected as an amplifier. The emitter 36 of the transistor 34 is connected to the positive side of a direct current voltage source 38, also 10 volts. The collector 40 is connected to an output load resistor 42.

A pair of input terminals 44 and 46 are provided to receive a negative input pulse 48. The pulse 48 has a duration greater than the longest time delay that is to be generated, in this case greater than 1 microsecond. The amplitude of the pulse 48 is approximately that of the voltage sources 18 and 38, and in this case is 10 volts negative.

The live terminal 44 is coupled through a blocking capacitor 50 and current limiting resistor 52 to the base 12 of the transistor 10. The terminal 44 is also coupled through a blocking capacitor 56, a rheostat 58 and current limiting resistor 60 to the junction point 28.

The operation of the circuit will now be described. Prior to the application of the input pulse 48 the transistor 10 is normally conducting and the transistor 34 is normally nonconducting. The source 18 supplies a small direct current between the base 12 and emitter 22 of the transistor 10, the value of this current being determined by the setting of the potentiometer 16. The current flowing in the base-emitter circuit of the transistor 10 gives rise to a larger current flow between the collector 20 and emitter 22, which current flows through the series resistor 24 and the diode 26 in its forward direction. While the diode 26 is conducting, the voltage drop thereacross is practically zero, and therefore the junction point 28 is substantially at ground potential.

When the negative input pulse 48 is applied to the input teminals 44 and 46, the voltage divides between the branch including the capacitor 50 and resistor 52 and the branch including capacitor 56, rheostat 58, and resistor 60. The portion of the pulse that is coupled through the capacitor 50 and resistor 52 to the base 12 of the transistor 10 reduces the potential of the base 12 below zero. Since the transistor 12 is connected as an emitter follower, whatever voltage is on the base 12 will appear on the emitter 22, as long as this voltage is positive, diminished only by the amount of voltage drop between the emitter 22 and base 12. Accordingly, the potential of the emitter 22 follows the potential of the base 12, until zero volts is reached, at which time current flow in the collector-emitter circuit through the diode 26 will cease. The interruption of current flow through the diode 26, when the transistor 10 switches off, leaves the former with a stored charge in the form of minority carriers, the exact amount depending upon the initial current flow as controlled by the setting of the potentiometer 16.

The portion of the input pulse that is coupled through the capacitor 56, the rheostat 58, and the resistor 60 drives the potential of the junction point 28 negatively so as to cause current to flow through the diode 26 in the reverse direction through the resistor 60, the rheostat 58 and the capacitor 56. The reverse current starts to deplete the stored charge on the diode 26 at a rate determined by the magnitude of the reverse current. While the diode 26 is being depleted of its stored charge and is conducting in the reverse direction, the voltage drop across the diode 26 is negligibly small and the junction point 28 is substantially at ground potential. The transistor 34 is still normally nonconducting.

When the stored charge on the diode 26 is fully depleted, after a time that is determined by the amount of charge originally stored and the rate of depletion, the diode 26 stops conducting. The potential at the junction point 28 suddenly rises negatively towards the potential of the junction between the capacitor 56 and the rheostat 58. The negative pulse appearing at the junction point 28 is coupled through the capacitor 30 to the base 32 of the transistor amplifier 34, causing current to flow out of the emitter-base junction of the transistor 34 and into the capacitor 30. The transistor 34 thereupon conducts heavily from the emitter 36 to the collector 40 and through the load resistor 42 to develop an amplified positive going output pulse 62 that is delayed with respect to the input pulse 48. The delay time *d* corresponds to the time during which the diode 26 is being depleted of its stored charge.

A desirable characteristic of the diode 26 is that it has low capacitance at zero voltage. Since the rate of negative rise in the potential of the junction point 28 is determined by the capacitance at that point, mainly the diode capacitance, when the diode 26 shuts off, a low diode capacitance will produce a rapid rise at the junction point 28 and a sharp output pulse 62. The diode 26 should also exhibit an adequate stored charge to forward current ratio. A type 1N989 diode fulfills both of these requirements.

Typical circuit values are as follows:

| | | |
|---|---|---|
| Transistor **10** | | Type 2N706 |
| Resistor **14** | kilohms | 1 |
| Potentiometer **16** | do | 10 |
| Resistor **24** | do | 1 |
| Diode **26** | | Type 1N989 |
| Capacitor **30** | microfarads | .001 |
| Transistor **34** | | Type 2N1195 |
| Resistor **42** | megohms | 1 |
| Capacitor **50** | microfarads | .05 |
| Resistor **52** | kilohms | 1 |
| Capacitor **56** | microfarads | .05 |
| Rheostat **58** | ohms | 500 |
| Resistor **60** | do | 100 |

With the above circuit values, the compact circuit of the invention is capable of producing a delay that is continuously variable from 5 nanoseconds to 1 microsecond.

The embodiments of the invention in which an exclusive property or privilege is claimed are defined as follows:

1. A delay circuit, comprising:

a series circuit including a semiconductor diode capable of storing carriers, a normally closed switching device and means for causing current of predetermined magnitude to flow through said semiconductor diode in the forward direction to inject carriers therein;

first circuit means coupled to said switching device for applying an input pulse thereto to interrupt the flow of current through said diode, thereby leaving a predetermined amount of stored charge in said diode;

second circuit means for coupling said input pulse to said diode to cause current to flow through said diode in the reverse direction, thereby to deplete the charge previously stored therein;

an output circuit means coupled to said diode for receiving the output voltage generated thereacross upon depletion of the stored charge.

2. The invention according to claim 1, wherein said switching device comprises a transistor emitter-follower circuit.

3. The invention according to claim 1, wherein said output circuit means comprises a transistor amplifier circuit.

4. The invention according to claim 1, wherein said first circuit means includes means for varying the current that is caused to flow in said diode in the forward direction.

5. The invention according to claim 1, wherein said second circuit means includes means for varying the current that is caused to flow in said diode in the reverse direction.

6. A delay circuit, comprising:

a first transistor connected in an emitter follower circuit;

a semiconductive diode exhibiting carrier storage properties connected in the emitter circuit of said first transistor;

circuit means for causing current to flow in the emitter circuit of said first transistor and through said diode in its forward direction to inject carriers therein;

circuit means for coupling a trigger pulse to said first transistor and to said diode to render said first transistor nonconducting thereby interrupting current flow in said diode in the forward direction, and to cause current to flow in said diode in the reverse direction to deplete the carriers stored in said diode;

and means for amplifying the voltage pulse developed across said diode upon depletion of its stored carriers.

7. A delay circuit, comprising:

a series circuit including semiconductor minority carrier storage means, normally closed switch means, and means for causing current to flow in said storage means in one direction for injecting minority carriers therein;

first circuit means coupled to said switch means for applying an input pulse thereto to interrupt the flow of current and thereby leave minority carriers stored in said storage means;

second circuit means for coupling said input pulse to said storage means to cause current to flow through said storage means in a direction opposite said one direction to deplete the minority carriers stored therein;

an output circuit means coupled to said storage means for receiving the output voltage generated thereacross upon depletion of the stored carriers.

References Cited in the file of this patent

UNITED STATES PATENTS

| | | |
|---|---|---|
| 3,050,640 | Dillingham | Aug. 21, 1962 |
| 3,091,705 | Levine | May 28, 1963 |